US006791423B2

(12) United States Patent
Leenaerts et al.

(10) Patent No.: US 6,791,423 B2
(45) Date of Patent: Sep. 14, 2004

(54) QUADRATURE COUPLED CONTROLLABLE OSCILLATOR AND COMMUNICATION ARRANGEMENT

(75) Inventors: Dominicus Martinus Wilhelmus Leenaerts, Eindhoven (NL); Eise Carel Dijkmans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/066,348

(22) Filed: Jan. 31, 2002

(65) Prior Publication Data

US 2002/0109556 A1 Aug. 15, 2002

(30) Foreign Application Priority Data

Feb. 1, 2001 (EP) .............................. 01220367

(51) Int. Cl.[7] ............................... H03K 3/281
(52) U.S. Cl. ................... 331/113 R; 331/135; 331/45; 331/48; 331/111; 331/143
(58) Field of Search ............................ 331/113 R, 111, 331/143, 45, 48

(56) References Cited

U.S. PATENT DOCUMENTS 6,188,292 B1 * 2/2001 Liu .............................. 331/45

OTHER PUBLICATIONS

A.Rofougaran et al, "SP 24.6: A 900MHz CMOS LC–Oscillator with Quadrature Outputs", ISSCC96/Session 24/Analog Techniques/Paper SP 24.6.

* cited by examiner

Primary Examiner—Arnold Kinkead

(57) ABSTRACT

A quadrature coupled controlled oscillator comprising a first and a second circuit module, each of the circuit modules (100 and 100') comprising an astable multivibrator circuit (103). The first circuit module is coupled with the second circuit module and the second circuit module is cross coupled with the first circuit module. Each of the circuit modules (100 and 100') comprises a first and a second Voltage Controlled Current Source (101) (VCCS). In each of the circuit modules, each VCCS is coupled to a phase shifter (102) for shifting the phase of a current (110) supplied by the VCCS to a resonator (104) included in that circuit module. A communication arrangement (300) for communicating via a bi-directional communication channel (304), comprises an oscillator (303) as described above for generating a periodic signal. A receiving module (301) generates an output signal from the periodic signal and a receiving signal received from the channel (304). The arrangement further comprises an emission module (302) for generating an emission signal for emitting to the channel from the periodic signal and an input signal.

25 Claims, 3 Drawing Sheets

QUADRATURE COUPLED CONTROLLABLE OSCILLATOR AND COMMUNICATION ARRANGEMENT

BACKGROUND OF THE INVENTION

This invention relates to a quadrature coupled controllable oscillator comprising a first and a second identical circuit module, the two circuit modules each comprising an astable multivibrator circuit, the first circuit module being coupled with the second circuit module and the second circuit module being cross coupled with the first circuit module, the oscillator comprising in each of the circuit modules a first and a second Voltage Controlled Current Source (VCCS).

The invention further relates to a communication arrangement.

Quadrature coupled controlled oscillators are very useful devices used in applications as wireless local area networks, optical fiber networks, mobile telephony, transceivers and many others.

The main requirements that these oscillators have to fulfill are low phase noise and large tuning range. These requirements impose the use of quadrature ring LC oscillators that can have a high quality factor Q that implicitly determines a low phase noise and a large tuning range.

Quadrature ring LC oscillators use two identical oscillator units that are coupled in order to obtain quadrature output oscillations. The oscillator units are astable multivibrators with inductors as their loads. The negative resistances that active devices, field effect transistors for example, present across their output terminals overcome the loss in the inductors so that the oscillation is self sustained.

Such a quadrature ring LC oscillator is disclosed in the paper SP 24.6: A 900 MHz CMOS LC—Oscillator with Quadrature Outputs presented at ISSCC in 1996, Session 24, pp.392–393.

In this known arrangement the two LC oscillator units are coupled using field effect transistors (FET). The inductors and the parasitic FET gate and drain capacitors form equivalent LC cells. The oscillation frequency is determined by the inductors inductance and the FET gate and drain junctions capacitances. The total current in the equivalent LC cells is the sum of the drain current of the astable multivibrator transistor and the drain current through the coupling FET. These two currents are phase-shifted with 90 degrees with respect each other. It should be pointed out here that the oscillation frequency is determined by technologically dependent parameters as the FET drain and gate capacitances and as a direct consequence the oscillation frequency is technology dependent as well. Furthermore, because of the 90 degrees phase shift in the currents the coupling coefficient between the oscillator units is relatively low and under certain conditions the oscillations cannot be synchronized in quadrature. The phase noise is still relatively high because the resonant circuit achieved by the inductor and the drain and gate capacitors, that are distributed, cannot have a high quality factor.

It is therefore an object of the present invention to provide a quadrature coupled controlled oscillator with an increased coupling coefficient and whose oscillation frequency is determined independently of the fabrication technology.

In accordance with the invention, this object is achieved in a device as described in the introductory paragraph, which is characterized in that each of the circuit modules has a resonator for determining the oscillation frequency of the astable multivibrator circuit comprised in that module, and that in each of the circuit modules each of the VCCS is coupled with a respective phase shifter for shifting the phase of a current supplied by the VCCS to the resonator comprised in that circuit module.

The phase shifters introduce a phase shift in the currents produced by the VCCS such that the currents through the VCCS and through an active device of the astable multivibrator circuit are substantially in phase, providing a maximum current through the resonator. As a direct consequence, the coupling coefficient between the two circuit modules increase, a better stability of the oscillation being obtained.

In a preferred embodiment the resonators are LC resonators and determine the oscillation frequency of the oscillator. Their L and C components have their inductance and capacitance much bigger than any other parasitic inductance and capacitance in the circuit and, as a matter of consequence, the oscillation frequency is determined independently of the technology. The resonators provide low impedance at their resonant frequency so that they must be supplied with the necessary currents to maintain a stable frequency of oscillation. The phase shifters and the VCCS achieve this goal. The resonators can be any type of LC resonators that are characterized in that the current through them attains it's maximum value at the oscillation frequency. As a direct consequence, the resonators are realized as a parallel connection between an inductor and a capacitor (tank circuit), two mutually inductively coupled tank circuits or any other combination of inductive and capacitive elements that behaves like a resonator characterized in that the current through it at the resonant frequency is maximum.

The oscillation frequency can be controlled in various modes, depending on the type of the resonator components, for example: electrically, mechanically, thermally, optically.

The oscillator according to the invention has the advantage of a lower phase noise and as a matter of consequence, the overall signal to noise ratio is increased.

Illustratively, all the previously described stages are realized with transistors and LC tank resonators. In an embodiment all these transistors are implemented in CMOS technology.

It is another object of the present invention to provide a communication arrangement for communicating via a bi-directional communication channel, comprising the novel oscillator disclosed and as claimed herein for generating a periodic signal, a receiving module for generating an output signal (OUT1) from the periodic signal and a received signal (IN) received from the channel, further comprising an emission module for generating an emission signal (OUT) for emitting to the channel from the periodic signal and an input signal (IN1).

The claimed communication arrangement is characterized in that the oscillator is conceived to provide a periodic signal to be mixed with the input signal (IN) in the receiving module in order to obtain a lower frequency signal (OUT1).

The communication arrangement is characterized in that the oscillator is conceived to provide a periodic signal to be mixed with the input signal (IN1) in the emission module in order to obtain the signal (OUT).

The above and other features and advantages of the invention will be apparent from the following description of exemplary embodiments of the invention with reference to the accompanying drawings, in which:

DESCRIPTION OF THE PREFERRED EMBODIMENT

Figure 1:
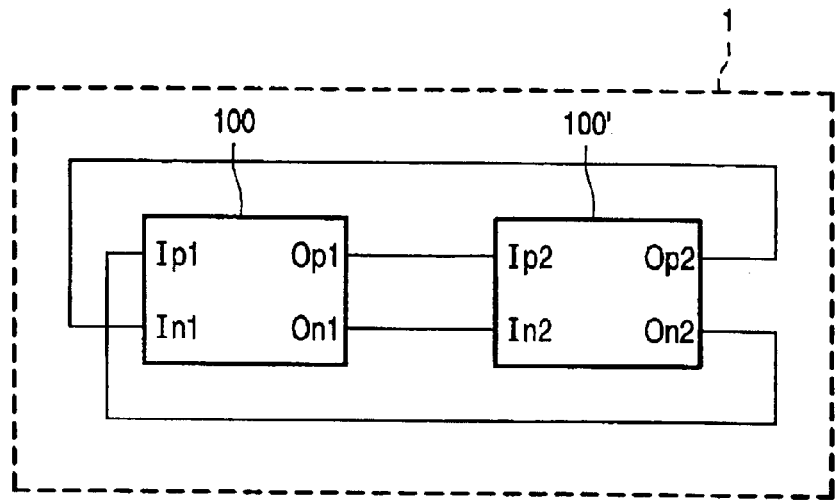
FIG. 1 depicts a block diagram of a quadrature coupled controllable oscillator.

FIG. 1 shows a block diagram of a quadrature coupled controlled oscillator (oscillator) according to the invention. There are provided two identical circuit modules 100 and 100'. The two circuit modules each have two inputs Ip1, In1 and Ip2, In2, respectively, and two outputs Op1, On1 and Op2, On2, respectively. The circuit module 100 is directly coupled to the circuit module 100', the output Op2, being connected to the input Ip2 and the output On1, being connected to the input In2. The circuit module 100' is cross coupled to the circuit module 100, the output Op2 being connected to the input In1 and the output On2 being connected to the input Ip1, respectively.

Figure 2:
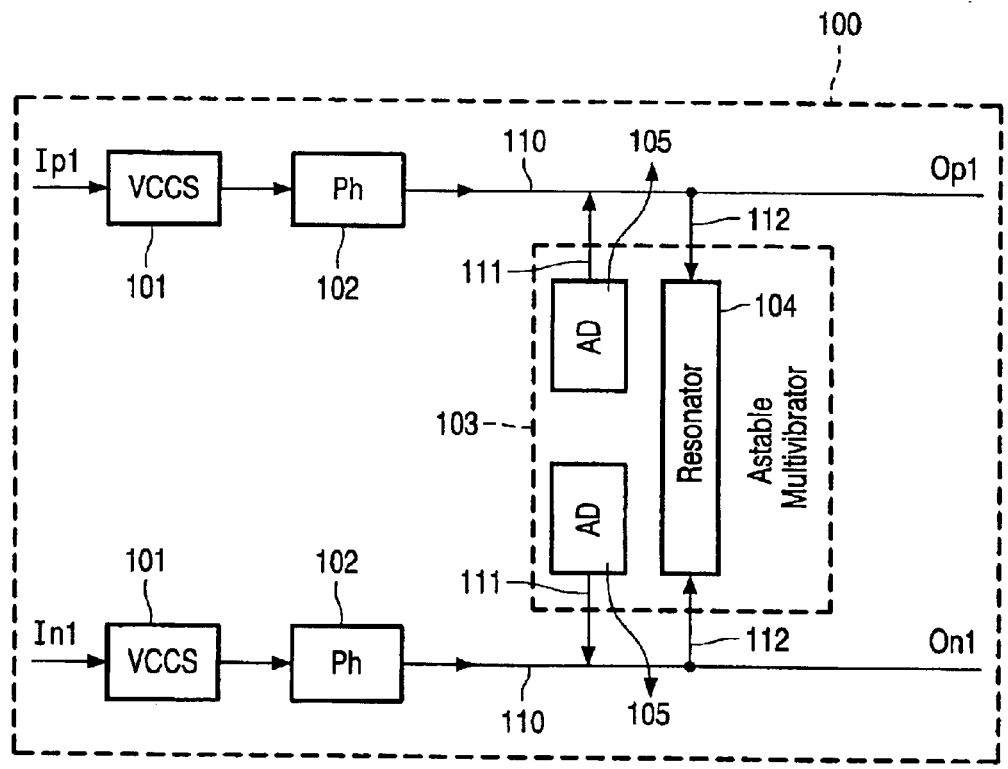
FIG. 2 depicts the block diagram of a module of an Oscillator as shown in FIG. 1, according to the invention.

FIG. 2 shows an embodiment of the circuit module 100. The circuit module 100' has the same structure as the circuit module 100 with the difference that there are provided input terminals Ip2, In2 and output terminals Op2, On2, respectively, instead of terminals In1, Ip1 and On1, Op1, respectively.

The circuit module 100 comprises Voltage Controlled Current Sources (VCCS) 101 that provide at their outputs currents that are promoduleal with input voltages Ip1 and In1, respectively. The VCCS are coupled with phase shifters 102 that shift the phase of the output currents of the VCCS providing at their output a phase shifted current 110. The phase shifters 102 are coupled with an astable multivibrator circuit 103. The astable multivibrator circuit is loaded with a resonator circuit 104 characterized in that when it's resonant frequency is attained, it must be supplied with a maximum current, the resonator impedance having it's minimum value. The current 112 through the resonator 104 is the sum of two currents: a current through an active device 105 of the astable multivibrator circuit 103 and the phase shifted current 110 of the VCCS 101 supplied by the phase shifters 102. When the astable multivibrator circuit oscillates with the resonance frequency of the resonator 104, the resonator must be supplied with a large current, otherwise a frequency shift appears and the two identical astable multivibrator circuits in the circuit modules 100 and 100' cannot be coupled in quadrature. In this condition the resonator behaves like a low Q circuit having a large phase noise level. In order to avoid the above mentioned situation the phase shifted current 110 provided by the phase shifter 102 and the current 111 through the active device 105 of the astable multivibrator 103 are phase shifted with a very small phase angle, so that they may be considered to be in phase. Under these circumstances, the current 112 supplied to the resonator 104 is as large as possible. Hence the astable multivibrator circuits oscillates with the frequency of the resonator 104, so that the phase noise is improved and the two identical astable multivibrator circuits are quadrature coupled. The two identical circuit modules 100 and 100' further comprise means to control the frequency of the oscillation of the oscillator. Depending on how the resonators are built these means are mechanical, electrical, optical, thermal.

Figure 3:
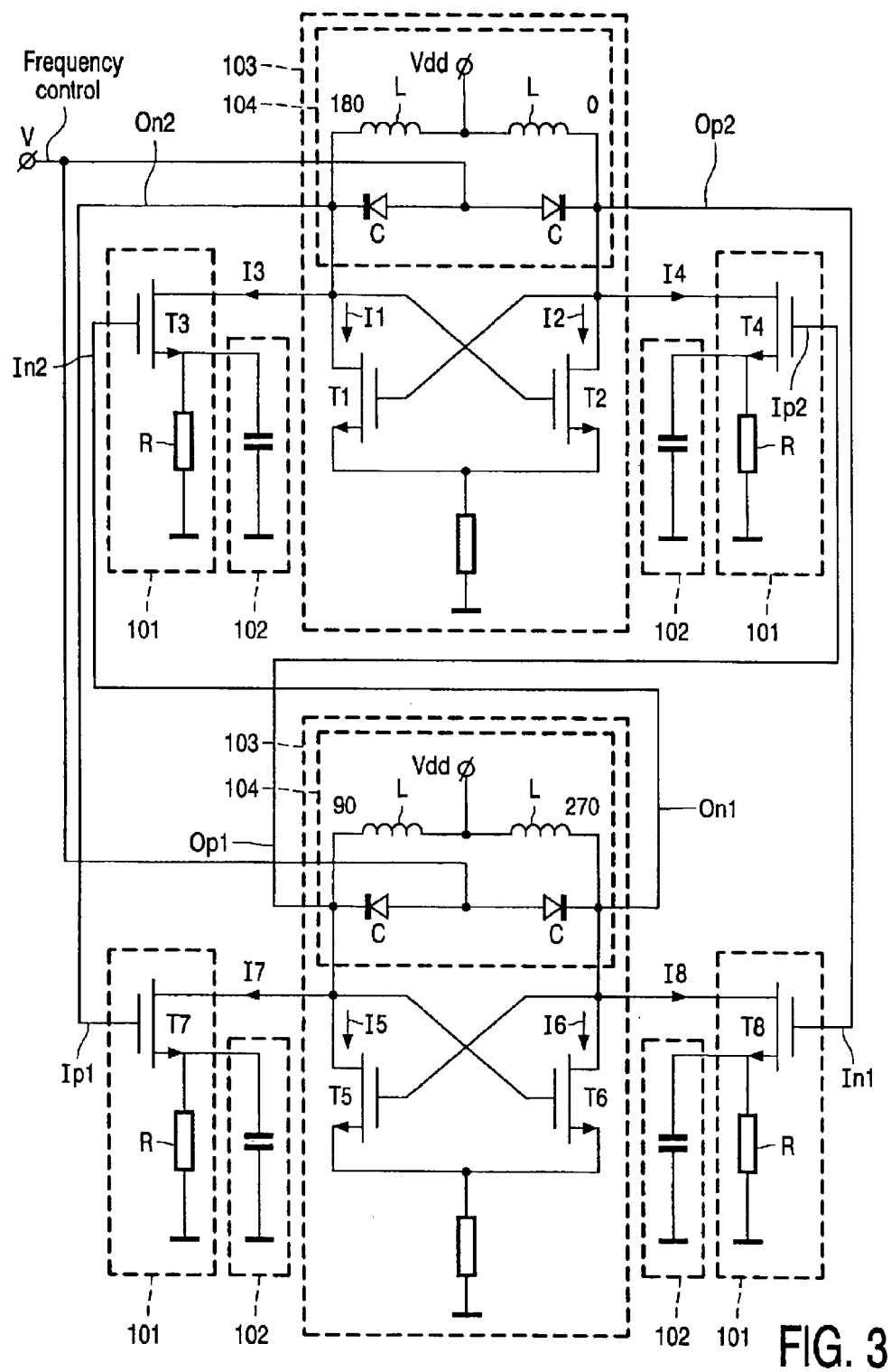
FIG. 3 depicts a CMOS implementation of the Oscillator according to one embodiment of the present invention.

An embodiment of a practical implementation of a quadrature coupled controlled oscillator (oscillator) is disclosed in FIG. 3. For illustrative purposes, CMOS transistors were used. However, the circuit may be implemented either in bipolar, CMOS or BiCMOS technologies, or a combination there of. For bipolar transistors, the control electrode, first main electrode and second main electrode correspond to the base, emitter and collector, respectively. For MOS transistors, the control electrode, first main electrode and second main electrode correspond to the gate, source and drain, respectively.

The two identical circuit modules 100 and 100' disclosed in FIG. 1 are indicated with dashed lines in FIG. 3.

The VCCS 101 disclosed in FIG. 2 are implemented here, as an example, with CMOS transistors T3, T4, T7 and T8. They are supplied via resistors R, but current sources can be used too.

The active devices 105 of the astable multivibrators 103 are implemented by transistors T1 and T2 for the circuit module 100' and by transistors T5 and T5 for the circuit module 100. The transistors are implemented in CMOS technology, but any type of controllable semiconductor element can be used instead.

Figure 4:
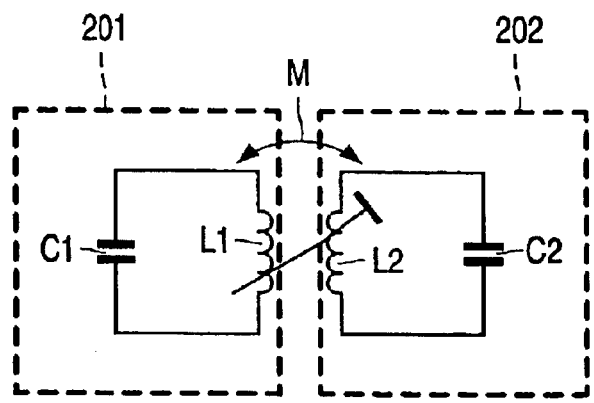
FIG. 4 depicts an embodiment of a resonator.

The resonators 104 are, for illustrative purposes, tank circuits realized as a parallel connection between an inductor L and a varicap diode C that acts as a variable capacitor. The resonator 104 can be any type of resonant circuit as long as it has minimum impedance at the resonant frequency. The resonator can be implemented as a tank circuit, coupled tank circuits as it is disclosed in FIG. 4 and any other implementation with the previous mentioned feature. The resonator in FIG. 4 comprises two LC tank circuits 201 and 202 that are coupled via a mutual inductance M. The tank circuit 201 comprise a LC tank circuit realized with the inductor L1 and the capacitor C1 and the tank circuit 202 is realized with the inductor L2 and the capacitor C2.

Depending on the particular implementation, the resonators resonant frequency is controlled with electrical, mechanical, optical, or thermal means. For illustrative purposes, the resonant frequency of the tank circuit 104 disclosed in FIG. 3 is controlled by a voltage V that controls the voltage across the varicap diodes C.

The phase shifters 102 are implemented here with capacitors but any phase shifter that realize an almost 0 degree phase shift between the currents through the transistors T1 and T3, T2 and T4, T5 and T7, T6 and T8 may be used instead.

The two identical circuit module 100 and 100' are coupled via the T3, T4 and T7, T8 respectively. The phase shift between the gate voltage and the drain voltage is almost 90 degrees because of the phase shifter 102. As a matter of consequence the currents I1 and I3, I2 and I4, I5 and I7, I6 and I8 are substantially in phase and the current supplied in the tank circuits 104 at the resonance is the maximum possible.

The currents 110 in FIG. 2 correspond to the currents I3, I4, I7 and I8 in FIG. 3 and the currents 111 in FIG. 2 correspond to the currents I1, I2, I5 and I6 in FIG. 3.

Figure 5:
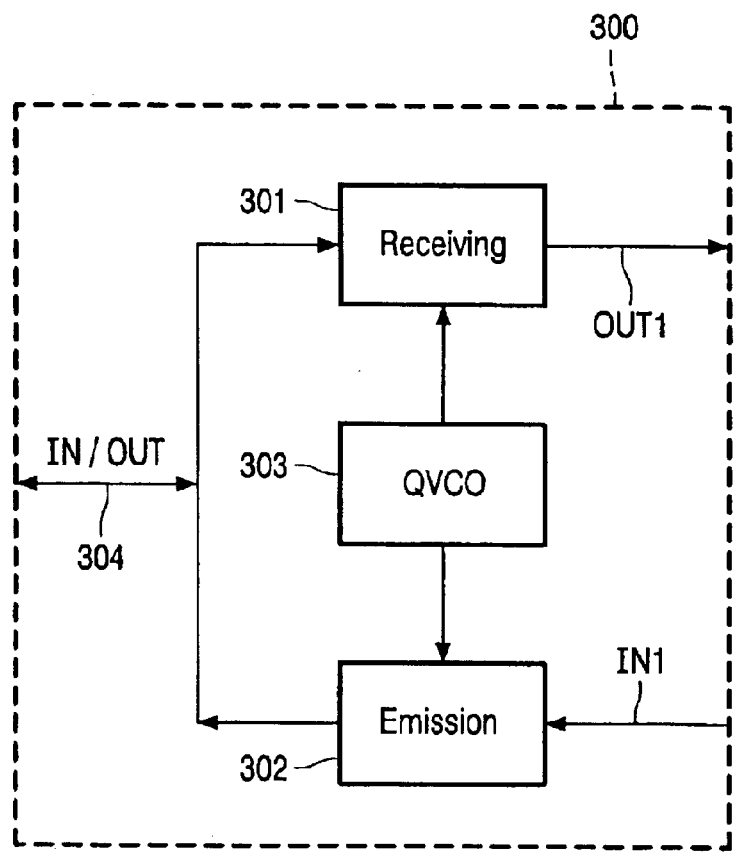
FIG. 5 depicts a communication arrangement for communicating via a bi-directional communication channel.

An embodiment of a communication arrangement 300 for communicating via a bi-directional communication channel 304 is presented in FIG. 5. The communication arrangement comprises a bi-directional communication channel 304 connected either to a receiving module 301 or to an emission module 302 depending on the application and/or the mode of operation where the arrangement is used. An oscillator (QVCO) 303 according to the invention provides a periodical signal either to the receiving module 301 or to the emission module 302. If a received signal IN is present in the bi-directional channel 304 then it is directed to the receiving module 301 where it is mixed with the periodical signal of the oscillator 303. At the output of the receiving module 301 it is obtained an output signal OUT1 that can be used as it is or can be further amplified and demodulated in order to obtain the useful information that it contains.

If an input signal IN1 is presented at the input of the emission (transmission) module 302, then it is mixed in the emission module 302 with the periodic signal provided by the oscillator 303. In the bi-directional channel 304 a signal OUT is then presented that is transmitted through the channel. It should be pointed out here that the bi-directional channel can be a simple antenna, an optical fiber and in general any device that could assure a bi-directional transmission/reception channel adapted for receiving and emitting signals, signals that can be electrical, optical, etc.

In a preferred embodiment of the invention, the output signal OUT1 is an intermediate frequency signal, the input signal IN1 is a suitable coded analogical signal, the bi-directional communication channel 304 is an antenna and the arrangement 300 is a transceiver used in a Bluetooth radio module preferably realized on a chip.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

What is claimed is:

1. A quadrature coupled controlled oscillator comprising:
    a first and a second circuit module, each of the circuit modules comprising an astable multivibrator circuit, the first circuit module being coupled with the second circuit module and the second circuit module being cross coupled with the first circuit module,
    a first and a second Voltage Controlled Current Source (VCCS) in each circuit module, characterized in that
    each of the circuit modules has a resonator for determining the oscillation frequency of the astable multivibrator circuit included in that circuit module,
    in each of the circuit modules each VCCS is coupled be a respective phase shifter for shifting the phase of a current supplied by the VCCS to the resonator included in that circuit module.

2. An oscillator as claimed in claim 1, further comprising means for controlling the oscillation frequency of the astable multivibrator circuits for controlling the oscillation frequency of the oscillator.

3. A quadrature coupled controlled oscillator comprising:
    a first and a second circuit module, each of the circuit modules comprising an astable multivibrator circuit, the first circuit module being coupled with the second circuit module and the second circuit module being cross coupled with the first circuit module,
    a first and a second Voltage Controlled Current Source (VCCS) in each circuit module, characterized in that
    each of the circuit modules has a resonator for determining the oscillation frequency of the astable multivibrator circuit included in that circuit module,
    in each of the circuit modules each VCCS is coupled to a respective phase shifter for shifting the phase of a current supplied by the VCCS to the resonator included in that circuit module, and
    the phase shifted current supplied by the VCCS end the current through an active device of the astable multivibrator circuit are substantially in phase.

4. An oscillator as claimed in claim 1 characterized in that the resonator is a LC circuit comprising at least a discrete inductor and a discrete capacitor.

5. An oscillator as claimed in claim 1 characterized in that the resonator comprises a first and a second LC circuit which are mutually inductively coupled.

6. A communication arrangement for communicating via a bi-directional communication channel, comprising an oscillator as claimed in claims 1 or 3 for generating a periodic signal, a receiving module for generating an output signal (OUT1) from the periodic signal and a received signal (IN) received from the communication channel, and further comprising an emission module for generating an emission signal (OUT) supplied to the communication channel from the periodic signal and an input signal (IN1).

7. An arrangement as claimed in claim 6 characterized in that the oscillator is arranged to provide a periodic signal to be mixed with the input signal (IN) in the receiving module in order to obtain a lower frequency output signal (OUT1).

8. An arrangement as claimed in claim 6 characterized in that the oscillator is arranged to provide a periodic signal to be mixed with the input signal (IN1) in the emission module in order to obtain the emission signal (OUT).

9. The communication arrangement as claimed in claim 6 further comprising means for controlling the oscillation frequency of the oscillator by controlling the oscillation frequency of the astable multivibrator circuits of the oscillator.

10. The communication arrangement as claimed in claim 6 wherein at least one resonator comprises a parallel resonant LC circuit.

11. The controlled oscillator as claimed in claim 1 wherein at least one resonator comprises an LC circuit in which a maximum current flows at the oscillation frequency.

12. A quadrature coupled controlled oscillator comprising:
    first and second circuit modules each of which comprise an oscillation circuit,
    first means coupling the first circuit module to the second circuit module,
    second means cross-coupling the second circuit module to the first circuit module, wherein
        each circuit module includes a first and a second voltage controlled current source (VCCS) and a first and a second phase shifter coupled to the first and second voltage controlled current sources, respectively, and
        each circuit module includes a resonator coupled to the first and second phase shifters therein and to its oscillation circuit and arranged so that the resonator determines the oscillation frequency of its respective oscillation circuit, each phase shifter shifting the phase of a current supplied by its respective voltage controlled current source to the resonator.

13. The controlled oscillator as claimed in claim 12 further comprising:
    means for controlling the oscillation frequency of the oscillator by control of the resonant frequency of the resonator of at least one circuit module.

14. The controlled oscillator as claimed in claim 13 wherein each resonator comprises an LC circuit in which the capacitor is a variable capacitor for control of the resonant frequency of the resonator.

15. The controlled oscillator as claimed in claim 14 wherein the capacitance of the capacitor is varied by means of a voltage applied thereto.

16. The controlled oscillator as claimed in claim 13 wherein control of the resonator resonant frequency controls the oscillation frequency of its respective oscillation circuit.

17. The controlled oscillator as claimed in claim 12 wherein each resonator comprises an LC circuit which, via a respective phase shifter, is arranged to pass a maximum current at its resonant frequency.

18. The controlled oscillator as claimed in claim 12 wherein each resonator comprises an LC circuit and the inductor and capacitor thereof are chosen so that any parasitic inductance or capacitance of the oscillator have negligible effect on the oscillation frequency of the oscillator.

19. The controlled oscillator as claimed in claim 1 wherein each resonator comprise a parallel resonant LC circuit having respective inductance and capacitance values much greater than any parasitic inductance or capacitance of the oscillator such that the oscillation frequency is substantially independent of the fabrication technology of the oscillator.

20. The controlled oscillator as claimed in claim 1 wherein the coupling between the first and second circuit modules and the cross-coupling between the second and first circuit modules is fixed.

21. The controlled oscillator as claimed in claim 12 wherein the oscillation circuits of the first and second circuit modules each comprise astable multivibrator circuit means coupled to its respective first and second phase shifters such that the phase shifted current supplied by the VCCS and the current through an active device of the astable multivibrator circuit means are substantially in phase.

22. An oscillator as claimed in claim 1 further comprising means for controlling the oscillation frequency of the astable multivibrator circuits independently of the coupling between the first and second circuit modules thereby to control the oscillation frequency of the oscillator.

23. The controlled oscillator as claimed in claim 12 wherein the oscillation circuits of the first and second circuit modules each comprise astable multivibrator circuit means coupled to its respective first and second phase shifters, and further comprising:

means for controlling the oscillation frequency of the astable multivibrator circuit means independently of the coupling between the first and second circuit modules thereby to control the oscillation frequency of the oscillator.

24. An oscillator as claimed in claim 1 wherein the phase shifter shifts the phase of the supplied current so that a maximum current flows through its respective resonator.

25. An oscillator as claimed in claim 1 wherein the resonators determine the oscillation frequency of the oscillator.

* * * * *